United States Patent
Maeda et al.

(10) Patent No.: US 8,513,683 B2
(45) Date of Patent: Aug. 20, 2013

(54) OPTICAL INTEGRATED SEMICONDUCTOR LIGHT EMITTING DEVICE

(75) Inventors: Osamu Maeda, Kanagawa (JP); Tsuyoshi Fujimoto, Miyagi (JP); Motonobu Takeya, Miyagi (JP); Toshihiro Hashidu, Miyagi (JP); Masaki Shiozaki, Kanagawa (JP); Yoshio Oofuji, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/344,468

(22) Filed: Jan. 31, 2006

(65) Prior Publication Data

US 2006/0192209 A1    Aug. 31, 2006

(30) Foreign Application Priority Data

Feb. 3, 2005   (JP) .................................. 2005-027815

(51) Int. Cl.
*H01L 33/00*   (2006.01)
(52) U.S. Cl.
USPC .......... 257/94; 257/85; 257/96; 257/E33.023; 257/E33.034
(58) Field of Classification Search
USPC  257/13, E33.008, 85, 94, 96, E33.023–E33.024
See application file for complete search history.

(56) References Cited

U.S. PATENT DOCUMENTS

| | | | | |
|---|---|---|---|---|
| 2001/0055325 | A1* | 12/2001 | Nemoto | 372/50 |
| 2003/0020087 | A1* | 1/2003 | Goto et al. | 257/103 |
| 2004/0124424 | A1* | 7/2004 | Tatsumi | 257/79 |
| 2004/0206975 | A1* | 10/2004 | Tojo et al. | 257/103 |
| 2004/0245540 | A1* | 12/2004 | Hata et al. | 257/99 |
| 2005/0141577 | A1* | 6/2005 | Ueta et al. | 372/43 |
| 2006/0038166 | A1* | 2/2006 | Tsuda et al. | 257/13 |

FOREIGN PATENT DOCUMENTS

| | | |
|---|---|---|
| JP | 2003-124572 | 4/2003 |
| JP | 2003-124573 | 4/2003 |
| JP | 2004-014943 | 1/2004 |
| JP | 2004-327655 | 11/2004 |
| JP | 2004-356586 | 12/2004 |

* cited by examiner

*Primary Examiner* — Minchul Yang
(74) *Attorney, Agent, or Firm* — Robert J. Depke; The Chicago Technology Law Group, LLC

(57) ABSTRACT

An optical integrated semiconductor light emitting device with improved light emitting efficiency is provided by preventing leak current from flowing through a high defect region of the substrate. The optical integrated semiconductor light emitting device includes: a substrate, in which in a low defect region made of crystal having a first average dislocation density, one or more high defect regions having a second average dislocation density higher than the first average dislocation density are included; and a Group III-V nitride semiconductor layer which is formed on the substrate, has a plurality of light emitting device structures, and has a groove in the region including the region corresponding to the high defect region (high defect region).

9 Claims, 9 Drawing Sheets

OPTICAL INTEGRATED SEMICONDUCTOR LIGHT EMITTING DEVICE

CROSS REFERENCES TO RELATED APPLICATIONS

The present invention contains subject matter related to Japanese Patent Application JP 2005-027815 filed in the Japanese Patent Office on Feb. 3, 2005, the entire contents of which being incorporated herein by reference.

BACKGROUND OF THE INVENTION

1. Field of the Invention

The present invention relates to an optical integrated semiconductor light emitting device capable of emitting a plurality of light, particularly to an optical integrated semiconductor light emitting device such as a multibeam laser diode device which can be suitably applied to a high density optical disk unit and a laser beam printer.

2. Description of the Related Art

In these years, as a light source of a high density optical disk unit and a laser beam printer, the multibeam laser diode device capable of driving a plurality of beams independently has attracted attention. The laser device has, for example, a Group III-V nitride semiconductor layer, in which an n-type buffer layer, an n-type cladding layer, an n-type guide layer, an active layer, a p-type guide layer, a p-type cladding layer, and a p-type contact layer are layered in this order on the surface of a GaN (gallium nitride) substrate. In the upper section of the Group III-V nitride semiconductor layer, specifically in the upper section of the p-type cladding layer and the p-type contact layer, a plurality of stripe-shaped ridges are formed. Each light emitting region (current injection region) formed in the region opposed to the plurality of ridges is separated from each other by the groove between the ridges. Further, an individual electrode (p-side electrode) is formed on each ridge, and a common electrode (n-side electrode) is formed on the whole rear face of the GaN substrate. A pair of reflector films is formed on the end faces perpendicular to the extending direction of each ridge.

In the multibeam laser diode device with such a structure, when a voltage with a given potential difference is applied between the selected individual electrode and the common electrode, a current is confined by the ridge, the current is injected to the current injection region of the active layer, and thereby light is emitted by electron-hole recombination. The light is reflected by the pair of reflector films, laser oscillation is generated in the wavelength in which phase change when the light reciprocates once in the device becomes integral multiple of $2\pi$, and the light is emitted as a beam outside from one of the reflector films.

In general, the foregoing GaN substrate has a structure in which a plurality of high defect regions are irregularly formed through low defect regions. In particular, in the case of the multibeam laser diode device having a plurality of light emitting regions, it is inevitable that the light emitting regions are formed in the high defect regions, leading to lowering of light emitting characteristics and reliability of the device. Therefore, in order to solve such a disadvantage, a method in which a Group III-V nitride semiconductor layer is layered on a GaN substrate in which high defect regions are regularly (cyclically) arranged in low defect regions has been proposed (refer to Japanese Unexamined Patent Application Publication No. 2003-124572). Thereby, it becomes possible to surely form a plurality of light emitting regions in the low defect regions, and to improve light emitting characteristics and reliability of the device.

SUMMARY OF THE INVENTION

As above, the GaN substrate described in the foregoing Japanese Unexamined Patent Application Publication No. 2003-124572 is a substrate having a superior crystal structure. Therefore, recently, development of the multibeam laser diode device using the GaN substrate has been actively implemented. However, the Group III-V nitride semiconductor layer formed on the GaN substrate has high defect regions passing through the Group III-V nitride semiconductor layer in the region opposed to the high defect regions of the GaN substrate. Further, the high defect regions have significantly high conductivity compared to the low defect regions. Therefore, part of the current injected from the electrode is not supplied to the light emitting region, but is leaked through the foregoing high defect regions. Consequently, there is a disadvantage that it is difficult to sufficiently supply the current contributing to light emission to the light emitting region, and light emitting efficiency of the device is decreased.

In view of such a disadvantage, in the present invention, it is desirable to provide an optical integrated semiconductor light emitting device, in which the light emitting efficiency is improved by preventing the leak current from flowing through the high defect regions of the substrate.

According to an embodiment of the present invention, there is provided an optical integrated semiconductor light emitting device including: a nitride semiconductor substrate, in which in a first region made of crystal having a first average dislocation density, one or more second regions having a second average dislocation density higher than the first average dislocation density are included; and a Group III-V nitride semiconductor layer which is formed on the nitride semiconductor substrate, has a plurality of light emitting device structures, and has a first groove in the region including the region corresponding to the second region.

In the optical integrated semiconductor light emitting device of the embodiment of the present invention, of the Group III-V nitride semiconductor layer, in the region including the region corresponding to the second region (high defect region) of the nitride semiconductor substrate, the first groove is formed. The first groove is provided by removing part of the high defect region on which dislocation propagated from the second region of the nitride semiconductor substrate concentrates from the Group III-V nitride semiconductor layer. Thereby, part of the current injected from the electrode is inhibited from bypassing the light emitting region and being leaked.

According to the semiconductor light emitting device of the embodiment of the present invention, of the Group III-V nitride semiconductor layer, in the region including the region corresponding to the second region with high dislocation density of the nitride semiconductor substrate, the first groove is formed. Therefore, part of the current injected from the electrode is inhibited from bypassing the light emitting region and being leaked. In the result, light emitting efficiency of the device is improved.

Other and further objects, features and advantages of the invention will appear more fully from the following description.

DETAILED DESCRIPTION OF THE PREFERRED EMBODIMENT

Descriptions will be given of an embodiment of the present invention in detail with reference to the drawings.

Figure 1:
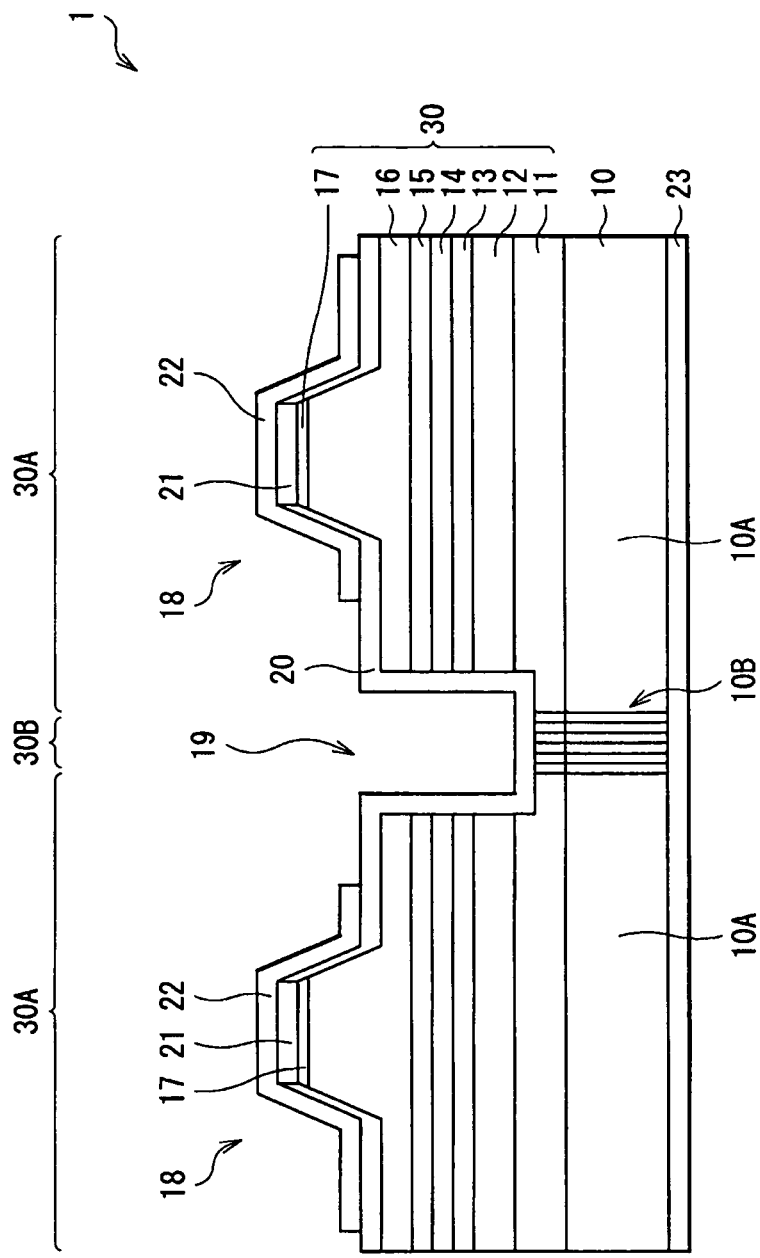
FIG. 1 is a view showing a cross sectional structure of a two-beam laser diode device according to an embodiment of the present invention.

FIG. 1 shows a cross sectional structure of a two-beam laser diode device 1 according to an embodiment of the present invention. The two-beam laser diode device 1 is an illustrative example of a monolithic multibeam laser diode device having a plurality of light emitting regions on a single substrate.

The two-beam laser diode device 1 has a laser structure (light emitting device structure) in which an n-type buffer layer 11, an n-type cladding layer 12, an n-type guide layer 13, an active layer 14, a p-type guide layer 15, a p-type cladding layer 16, and a p-type contact layer 17, which are respectively made of a Group III-V nitride semiconductor material, are layered in this order on the surface of a substrate 10 made of GaN (nitride semiconductor substrate). Hereinafter, the direction of layering the foregoing semiconductor layer is referred to as vertical direction, the emission direction of laser light is referred to as axial direction, and the direction perpendicular to the axial direction and the vertical direction is referred to as lateral direction.

Of a Group III-V nitride semiconductor layer 30, in which the Group III-V nitride semiconductor materials are layered, the n-type buffer layer 11 is made of, for example, n-type GaN; the n-type cladding layer 12 is made of, for example, n-type AlGaN; and the n-type guide layer 13 is made of, for example, n-type GaN. The active layer 14 has, for example, an undoped GaInN multiquantum well structure. The p-type guide layer 15 is made of, for example, p-type GaN; the p-type cladding layer 16 is made of, for example, AlGaN; and the p-type contact layer 17 is made of, for example, p-type GaN. As the foregoing n-type impurity, for example, silicon (Si), selenium (Se) or the like can be cited. As p-type impurity, zinc (Zn), magnesium (Mg) or the like can be cited.

The substrate 10 has a plurality of high defect regions 10B (second region) having an average dislocation density (second average dislocation density) higher than of a low defect region 10A in the low defect regions 10A (first region) with a low average dislocation density (first average dislocation density). Here, the substrate 10 has the high defect region 10B in the central region in the lateral direction, and has the low defect regions 10A in the regions on the both sides of the high defect region 10B.

Figure 2:
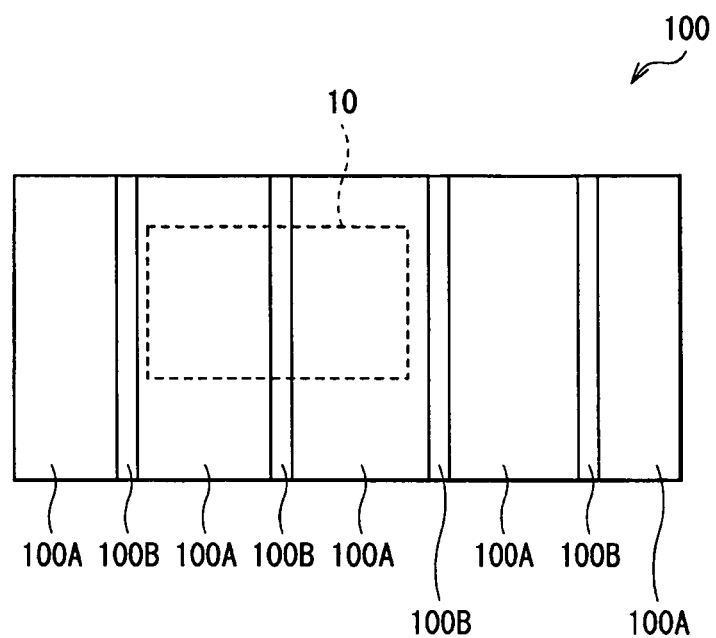
FIG. 2 is a view showing a planar state of a GaN substrate used for the laser device of FIG. 1.

As shown in FIG. 2, the substrate 10 is made of a member obtained by cutting part of a GaN substrate 100, in which high defect regions 100B are regularly (cyclically) arranged in low defect regions 100A at a cycle of, for example, about several hundred μm in the lateral direction. The high defect regions 100B are continuous stripe-shape which extends in the axial direction on the surface of the GaN substrate 100 and are planar shapes passing through the GaN substrate 100 in the axial direction and the vertical direction. The average dislocation density in the low defect region 100A of the GaN substrate 100 is, for example, $5\times10^5$ cm$^{-2}$, and the average dislocation density in the high defect region 100B is, for example, $2\times10^8$ cm$^{-2}$.

For example, as described in detail in Japanese Unexamined Patent Application Publication No. 2003-124572, the foregoing GaN substrate 100 is formed by crystal growth with slant faces composed of facets maintained. By using such a crystal growth method, regions with a high dislocation density can be collected on a given region, and as described above, the regions with a high dislocation density and regions with a low dislocation density can be regularly and cyclically formed. In the result, as described later, the laser structure can be formed only in the regions with a low dislocation density, and devices with superior light emitting characteristics can be formed.

Meanwhile, the Group III-V nitride semiconductor layer 30 has a high defect region 30B in the portion corresponding to the high defect region 10B of the substrate 10, and has a low defect region 30A in the portion corresponding to the low defect region 10A. As described later, since the Group III-V nitride semiconductor layer 30 is formed on the substrate 10 by epitaxial growth by using, for example, MOCVD (Metal Organic Chemical Vapor Deposition) method, crystal dislocation of the substrate 10 is propagated to the Group III-V nitride semiconductor layer 30.

Further, in part of the p-type cladding layer 16 and the p-type contact layer 17, as described later, by forming layers up to the p-type cladding layer 16 and then performing selective etching, a plurality of stripe-shaped ridges 18 extending in the axial direction are provided. The ridge 18 is formed in each low defect region 30A of the Group III-V nitride semiconductor layer 30. Of the active layer 14, in the region corresponding to the ridge 18, a current injection region (light emitting region) is formed. The ridge 18 has a function to limit the size of the current injection region of the active layer 14, and a function to stably control the optical mode in the lateral direction to the basic (zero order) mode and implement waveguide in the axial direction.

In the region between the adjacent ridges 18, a groove 19 (first groove) is respectively formed. The both side faces of each ridge 18 including the inner face of the groove 19 are covered with an insulating film 20. On the p-type contact layer 17 of each ridge 18, an individual electrode (p-side electrode 21) is formed. A p-side extraction electrode 22 is provided on the surface of the p-side electrode 21 and over the surface of the insulating film 20. Meanwhile, on the whole rear face of the substrate 10, a common electrode (n-side electrode 23) is provided. On the surface perpendicular to the extending direction of the ridge 18 (axial direction), a pair of reflector films (not shown) is formed.

The groove 19 is provided in the region including the high defect region 30B of the Group III-V nitride semiconductor layer 30, and insulates and separates the adjacent laser structures from each other. Specifically, the groove 19 is provided so that the portion adjacent to the ridge 18 of the high defect region 30B passing through the Group III-V nitride semiconductor layer 30 is removed. The groove 19 has a depth to the degree that the light emitting region corresponding to each ridge 18 can be electrically separated from each other, that is, for example, a depth to the degree of reaching the n-type buffer layer 11. Therefore, in the Group III-V nitride semiconductor layer 30, the high defect region 30B exists only in the n-type buffer layer 11, and does not exist in the n-type cladding layer 12, the n-type guide layer 13, the active layer 14, the p-type guide layer 15, the p-type cladding layer 16, and the p-type contact layer 17.

The insulating film 20 is made of, for example, silicon dioxide ($SiO_2$) or silicon nitride (SiN). The p-side electrode 21 is made by layering, for example, a palladium (Pd) layer and a platinum (Pt) layer in this order. The p-side lead electrode 22 is made by layering, for example, a titanium (Ti) layer, a platinum (Pt) layer, and a gold (Au) layer from the p-type contact layer 17 side. The n-side electrode 23 has a structure in which, for example, an alloy layer of gold and germanium (Ge), a nickel (Ni) layer, and gold (Au) layer are layered in this order from the substrate 10 side.

Further, one of the pair of reflector films (main emission side) is made of, for example, aluminum oxide ($Al_2O_3$), and is adjusted to have low reflectance. Meanwhile, the other reflector film is made by alternately layering an aluminum oxide layer and an amorphous silicon layer, and is adjusted to have high reflectance. Thereby, light generated in the light emitting region in the active layer 14 travels between the pair of reflector films and is amplified, and is emitted as a beam from the reflector film on the low reflectance side.

The two-beam laser diode device 1 having such a structure can be manufactured, for example, as follows.

Figure 3:
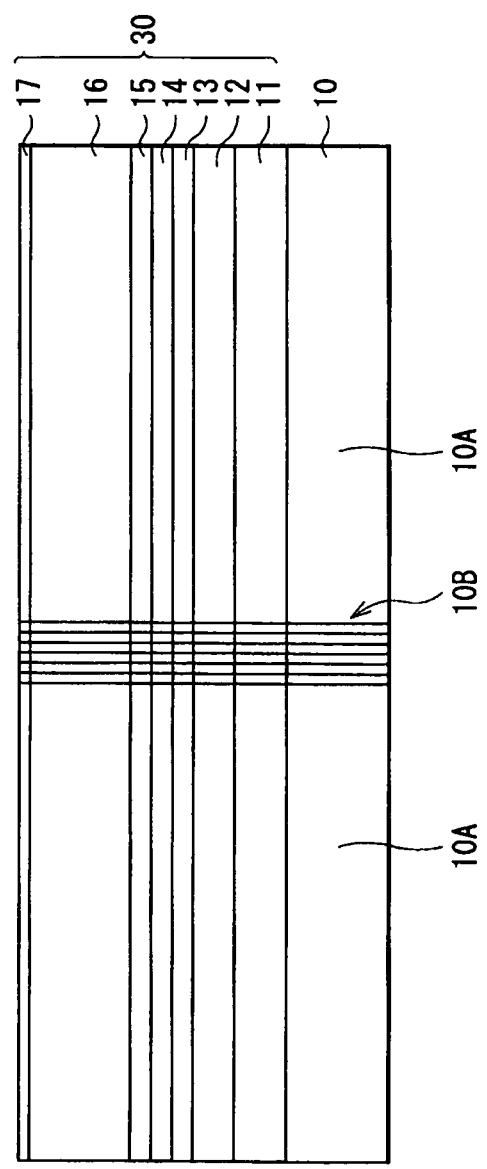
FIG. 3 is a cross section for explaining a manufacturing step of the laser device of FIG. 1.
Figure 4:
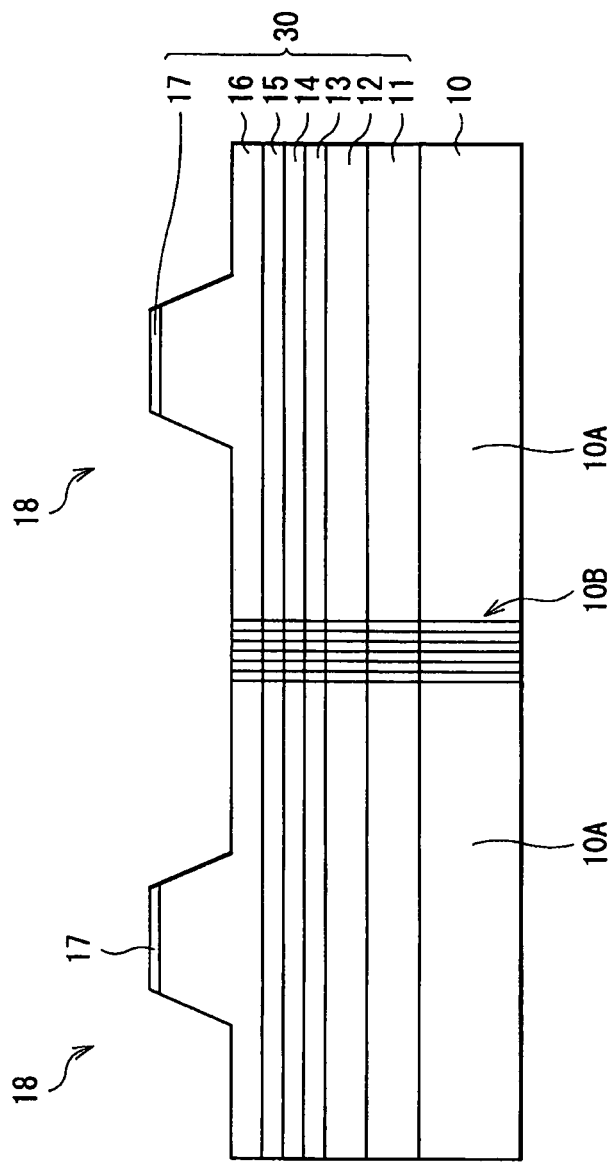
FIG. 4 is a cross section for explaining a step following FIG. 3.
Figure 5:
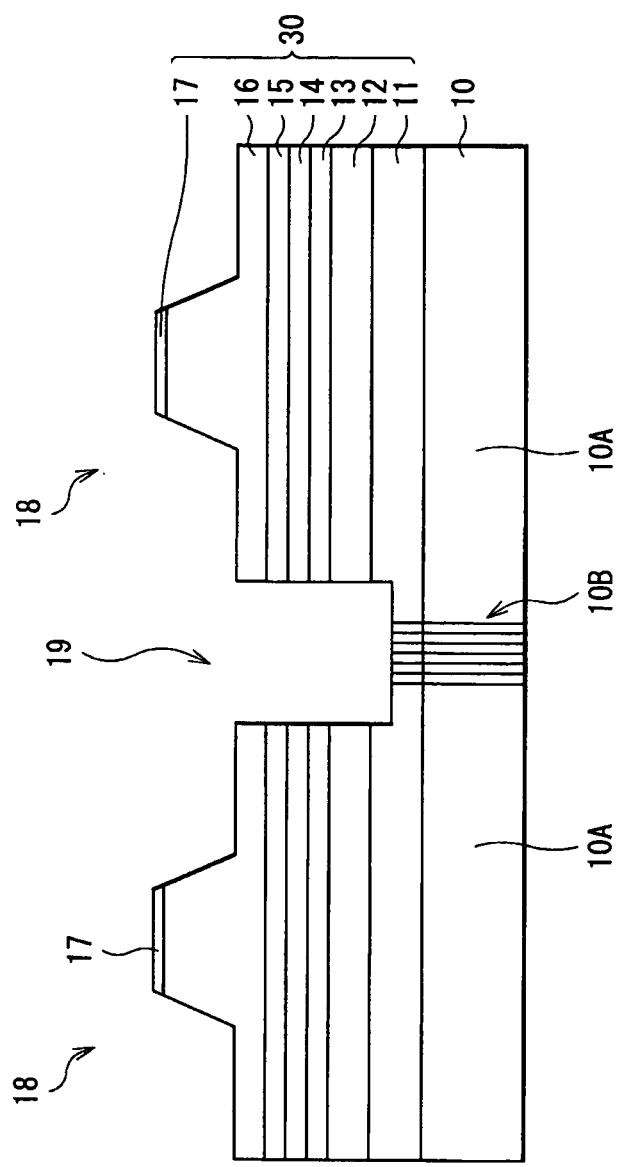
FIG. 5 is a cross section for explaining a step following FIG. 4.

FIG. 3 to FIG. 5 show the manufacturing method in the order of steps. In order to manufacture the two-beam laser diode device 1, the Group III-V nitride semiconductor layer 30 on the GaN substrate 100 (refer to FIG. 2) is formed by, for example, MOCVD method. Then, as a raw material of the GaN compound semiconductor, for example, trimethyl aluminum (TMA), trimethyl gallium (TMG), trimethyl indium (TMIn), or ammonia ($NH_3$) is used. As a raw material of donor impurity, for example, hydrogen selenide ($H_2Se$) is used. As a raw material of acceptor impurity, for example, dimethyl zinc (DMZn) is used.

Specifically, first, as shown in FIG. 3, on the GaN substrate 100, the n-type buffer layer 11, the n-type cladding layer 12, the n-type guide layer 13, the active layer 14, the p-type guide layer 15, the p-type cladding layer 16, and the p-type contact layer 17 are layered in this order.

Next, as shown in FIG. 4, for example, a mask layer (not shown) is formed on the p-type contact layer 17, and the p-type contact layer 17 and part of the p-type cladding layer 16 are selectively removed by Reactive Ion Etching (RIE). After that, the mask layer is removed. Thereby, two stripe-shaped ridges 18 extending in the axial direction in the low defect regions 30A of the Group III-V nitride semiconductor layer 30 are formed.

Next, as shown in FIG. 5, a new mask layer (not shown) is formed, and in the high defect region 30B of the Group III-V nitride semiconductor layer 30 and in the region including part of the low defect regions 30A on the both sides of the high defect region 30B, the groove 19 which reaches up to the n-type buffer layer 11 and extends in the axial direction is formed. After that, the mask layer is removed. Thereby, the Group III-V nitride semiconductor layer 30 is separated into two sections, and the grove 19 in which the high defect region 30B is exposed on the bottom thereof is formed. Then, each ridge 18 is located at a given distance from the groove 19 in the low defect region 30A.

Next, as shown in FIG. 1, the surface of the Group III-V nitride semiconductor layer 30 including the inner face of groove 19 is coated with an insulating material, and then lithography process and etching process are performed, and thereby the insulating film 20 having an aperture above the p-type contact layer 17 of each ridge 18 is formed. Subsequently, by performing lift-off process, the p-side electrode 21 is formed in the aperture of the insulating film 20. Further, by performing lithography process, etching process, and lift-off process, the p-side lead electrode 22 electrically connected to the p-side electrode 21 located on the ridge 18 is formed.

Further, for example, the rear face side of the GaN substrate 100 is lapped and the thickness of the GaN substrate 100 is adjusted to a given thickness. After that, the common electrode (n-side electrode 23) is formed by performing lithography process, etching process, and lift-off process. After that, scribing process and cleavage are performed for the GaN substrate 100, and the reflector films (not shown) are formed on a pair of side faces in the axial direction. Thereby, the two-beam laser diode device 1 is formed.

Next, descriptions will be given of the operation and effects of the two-beam laser diode device 1 of this embodiment.

In the two-beam laser diode device 1, when a voltage with a given potential difference is applied between the p-side electrode 21 and the n-side electrode 22 of the two ridges 18, respectively, a current confined by the ridges 18 is injected to the current injection region (light emitting region), and thereby light emission by electron-hole recombination is generated. The light is reflected by the pair of reflector films, laser oscillation is generated in the wavelength, in which phase change when the light reciprocates once becomes integral multiple of $2\pi$, and the light is emitted outside as two beams. When only one ridge 18 is driven, one beam is emitted.

As things to be particularly noted when the two laser devices are driven independently from each other as described above, for example, electrical cross talk and leak current can be cited. However, in the traditional two beam laser diode device, as described above, the high defect regions pass thorough the semiconductor layer on the substrate in the vertical direction, and therefore part of the current injected from the p-side electrode does not flow in the light emitting region in the laser device, but is leaked to the n-side electrode through the low resistance region (high defect region). Therefore, a disadvantage is caused as follows. That is, part of the current supplied from the p-side electrode is not supplied to the light emitting region and the light emitting efficiency of the device is lowered, and furthermore in the case that the current leak amount is large, the device does not emit light.

Meanwhile, in the two-beam laser diode device 1 of this embodiment, the high defect region 30B passing through the Group III-V nitride semiconductor layer 30 formed on the substrate 10 in the vertical direction exists only in part of the buffer layer 11. Therefore, there is no risk that part of the current injected from the p-side electrode 21 does not flow in the light emitting region in the laser device, and is leaked to the n-side electrode 23 through the low resistance region (high defect region 30B). Thereby, almost all the current supplied from the p-side electrode 21 is supplied to the light emitting region, and thereby light emitting efficiency of the device is improved.

Further, in this embodiment, the two ridges 18 are formed at a given distance from the high defect region 30B in the low defect region 30A of the Group III-V nitride semiconductor layer 30. In general, the defect density in the lateral direction of the low defect region 30A has the property that the larger the distance between the low defect region 30A and the high defect region 30B is, the smaller the defect density becomes. Further, in general, each light emitted from a plurality of light emitting regions formed in the region with the defect density equal to each other has optical property equal to each other. Therefore, in the two beam laser diode device 1, since the light emitting region exists in the position corresponding to each ridge 18 in the region with a defect density equal to each other, that is, in the region at a given distance from the high defect region 30B, each light from each light emitting region has optical property equal to each other.

Descriptions have been hereinbefore given of the present invention with reference to the embodiment. However, the present invention is not limited to the foregoing embodiment, and various modifications may be made.

Figure 6:
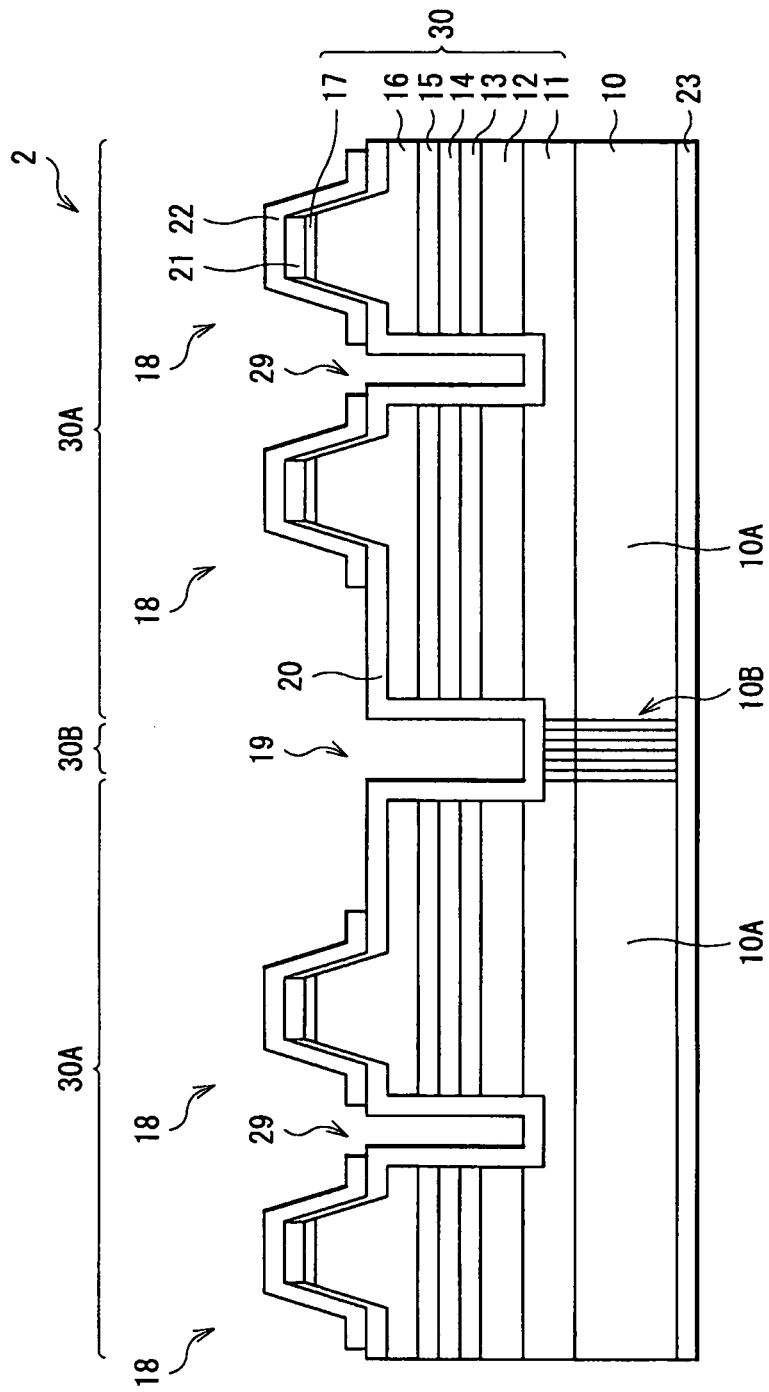
FIG. 6 is a view showing a cross sectional structure of a four-beam laser diode device according to a modification.

For example, the present invention can be applied not only to the two-beam laser diode device 1, but also to three or more beam laser diode device. For example, as shown in FIG. 6, a four-beam laser diode device has a structure similar to of the foregoing first embodiment, except that four ridges 18 are provided, grooves 29 are further provided in addition to the groove 19 as a groove for separating the light emitting regions corresponding to each ridge 18, and the action and effects are similar to of the foregoing first embodiment. The groove 29 is intended to electrically separate the light emitting regions of the adjacent ridges 18.

Figure 7:
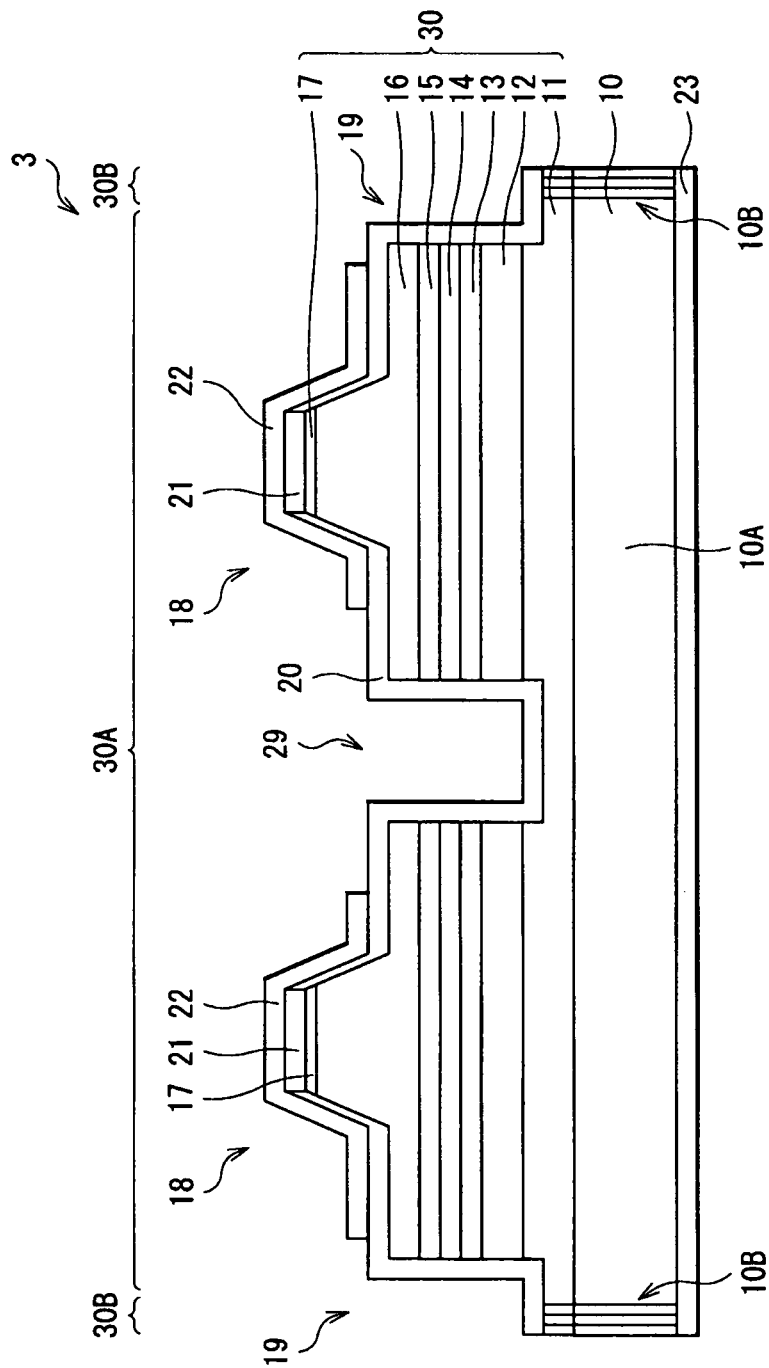
FIG. 7 is a view showing a cross sectional structure of a two-beam laser diode device according to a modification.
Figure 8:
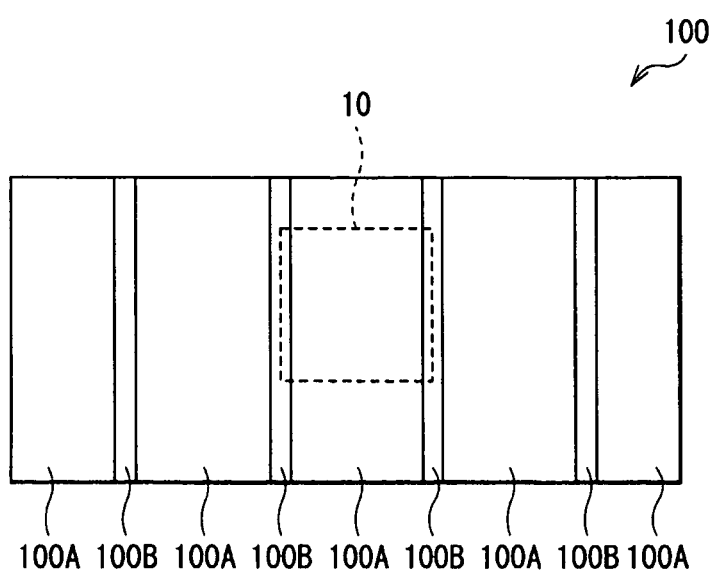
FIG. 8 is a view showing a planar state of a GaN substrate utilized for the laser device of FIG. 7.

Further, in the foregoing embodiment, the high defect region 10B is located in the central region of the substrate 10, and each low defect region 10A exists on the both sides of the high defect region 10B. However, as shown in FIG. 8, it is possible that the low defect region 10A is located in the center of the substrate 10, and the high defect regions 10B exist on the both sides of the low defect region 10A. However, when the substrate 10 with such a crystal structure is used, as shown in FIG. 7, the two ridges 18 are formed in a position at a given distance from the high defect region 10B in the low defect region 10A, and the groove 29 is newly formed in the region sandwiched between the ridges 18.

In a two-beam laser diode device 3 with such a structure, as in the foregoing embodiment, almost all the current supplied from the p-side electrode 21 is supplied to the light emitting region, and light emitting efficiency of the device is improved. Further, light emitted from each light emitting region has optical property equal to each other.

Figure 9:
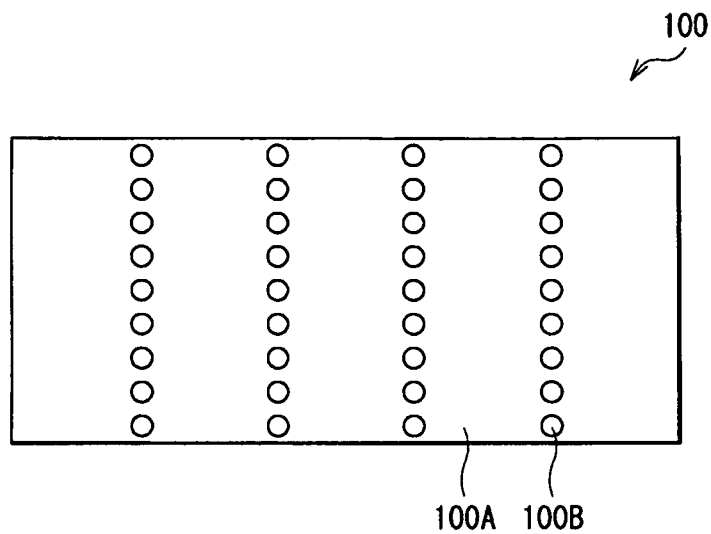
FIG. 9 is a view showing a modification of the GaN substrate of FIG. 2.
Figure 10:
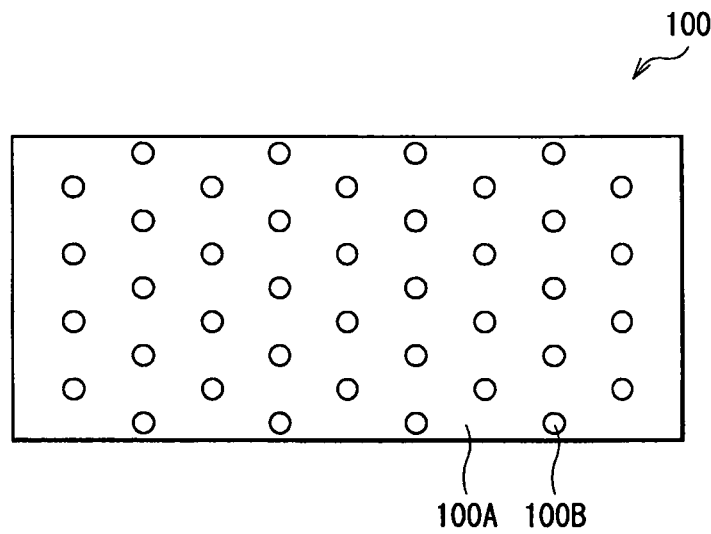
FIG. 10 is a view showing another modification of the GaN substrate of FIG. 2.

Further, in the foregoing embodiment, the high defect region 10B is continuous stripe-shape, continuously extending in the axial direction on the surface of the GaN substrate 100. However, the high defect region 10B can be discontinuous stripe-shape as shown in FIG. 9, or can be dotted as shown in FIG. 10.

Further, in the foregoing embodiment, the current confinement structure by the ridge 18 is used. However, the structure can be obtained by other method.

Further, the present invention can be applied not only to the two-beam laser diode device or the four-beam laser diode device, but also to several beam laser diode devices.

Further, the present invention can be generally applied to semiconductor light emitting devices such as a light emitting diode device in addition to the laser diode device.

It should be understood by those skilled in the art that various modifications, combinations, sub-combinations and alternations may occur depending on design requirements and other factors insofar as they are within the scope of the appended claims or the equivalents thereof.

What is claimed is:

1. An optical integrated semiconductor light emitting device comprising:
 a nitride semiconductor substrate having first regions with a first average dislocation density and one second region having a second average dislocation density substantially higher than the first average dislocation density, two light emitting device structures formed such that one is located at each of said first regions, and a groove formed in a plurality of Group III-V nitride semiconductor layers formed over the substrate, the two light emitting device structures being formed of the plurality of Group III-V nitride semiconductor layers formed over the first regions and the groove being formed in the second region of the substrate between the light emitting device structures; and
 further wherein there is only one second region having a second average dislocation density higher than the first average dislocation density and it is located between the first regions of the substrate at which the two light emitting device structures are formed and the second region extends only partially through a depth of a buffer layer and an electrode is formed on a side of the substrate which is opposite a side at which the two light emitting device structures are formed, and further wherein there is an insulating layer covering the groove, the insulating layer extending in the groove through at least part of the buffer layer and extending up to ridge portions at which the two light emitting device structures are formed and electrodes are formed over the insulating layer at the ridge portions, wherein the ridge portions are tapered and limit a size of a current injection region, and further wherein the buffer layer is a substantially common planer layer that extends beneath the two light emitting device structures having a portion removed at the groove and the insulating layer extends to portions on each side of the second region of the buffer layer such that the insulating layer extends to portions of the buffer layer having fewer defects than the second region.

2. The optical integrated semiconductor light emitting device according to claim 1, wherein the nitride semiconductor substrate is formed by cutting part of a semiconductor substrate, in which a plurality of the second regions and the first regions are regularly arranged.

3. The optical integrated semiconductor light emitting device according to claim 1, wherein each of the plurality of light emitting device structures respectively has a light emitting active layer formed only in a region corresponding to one of the first regions of the substrate and such that no portions of the first region have a dislocation density greater than or equal to the dislocation density of the second region.

4. The optical integrated semiconductor light emitting device according to claim 1, wherein the second region has an arrangement selected from the group consisting of discontinuous stripe shape and dotted shape on the surface of the nitride semiconductor substrate.

5. The optical integrated semiconductor light emitting device according to claim 1, wherein an insulating film is formed on inner faces of the first groove.

6. An optical integrated semiconductor light emitting device comprising:
 a nitride semiconductor substrate comprising two first regions having a first average dislocation density and one second region having a second average dislocation density substantially higher than the first average dislocation density, four light emitting device structures, two of which are formed at each of said first regions, and a groove formed in a plurality of Group III-V nitride semiconductor layers formed over the substrate, the four light emitting device structures being comprised of the plurality of Group III-V nitride semiconductor layers formed over the first regions and the groove being formed at the second region of the substrate and which extends only partially through a depth of a buffer layer; and further wherein there is a second region having a second average dislocation density higher than the first average dislocation density and it is located between the first regions of the substrate at which the four light emitting device structures are formed and an electrode formed on a side of the substrate which is opposite a side at which the four light emitting device structures are formed, and further wherein there is an insulating layer covering the groove, the insulating layer extending in the groove through at least part of the buffer layer and extending up to ridge portions at which the light emitting device structures are formed and electrodes are formed over the insulating layer at the ridge portions, wherein the ridge portions are tapered and limit a size of a current injection region, and further wherein the buffer layer is a substantially common planer layer that extends beneath the two light emitting device structures having a portion removed at the groove and the insulating layer extends to portions on each side of the second region of the buffer layer such that the insulating layer extends to portions of the buffer layer having fewer defects than the second region.

7. The optical integrated semiconductor light emitting device according to claim 1, further comprising a common n-side electrode formed over a surface of the substrate opposite the surface over which the Group III-V nitride semiconductor layer is formed.

8. The optical integrated semiconductor light emitting device according to claim 1, wherein an individually addressable p-side electrode is formed over each of the light emitting device structures.

9. The optical integrated semiconductor light emitting device according to claim 6, wherein a second groove extends through at least a second conductive cladding layer, an active layer, and a first conductive cladding layer, and to or partially into a nitride buffer layer formed over the substrate, but does not reach the substrate.

\* \* \* \* \*